(12) United States Patent
Zhao et al.

(10) Patent No.: US 6,627,539 B1
(45) Date of Patent: Sep. 30, 2003

(54) METHOD OF FORMING DUAL-DAMASCENE INTERCONNECT STRUCTURES EMPLOYING LOW-K DIELECTRIC MATERIALS

(75) Inventors: Bin Zhao, Irvine, CA (US); Maureen R. Brongo, Laguna Hills, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/149,910

(22) Filed: Sep. 9, 1998

Related U.S. Application Data
(60) Provisional application No. 60/087,116, filed on May 29, 1998.

(51) Int. Cl.⁷ .................. H01L 21/44; H01L 21/4763
(52) U.S. Cl. ............ 438/638; 438/622; 438/623; 438/624; 438/626
(58) Field of Search .................. 438/638, 622, 438/623, 627, 643, 636, 637, 648, 653, 656, 672, 685, 687, 902, 624

(56) References Cited

U.S. PATENT DOCUMENTS

| | | | |
|---|---|---|---|
| 4,789,648 A | * 12/1988 | Chow | 437/225 |
| 5,256,274 A | 10/1993 | Poris | |
| 5,521,424 A | 5/1996 | Ueno et al. | |
| 5,548,159 A | 8/1996 | Jeng | |
| 5,578,523 A | * 11/1996 | Fiordalice | 437/190 |
| 5,593,741 A | 1/1997 | Ikeda | |
| 5,612,254 A | 3/1997 | Mu et al. | |
| 5,739,579 A | * 4/1998 | Chiang | 257/635 |
| 5,741,626 A | * 4/1998 | Jain | 430/314 |
| 5,891,803 A | * 4/1999 | Gardner | 438/660 |
| 5,915,203 A | * 6/1999 | Sengupta et al. | 438/669 |
| 5,977,635 A | * 11/1999 | Tobben | 257/760 |
| 5,985,125 A | * 11/1999 | Kim | 205/123 |
| 6,037,664 A | * 3/2000 | Zhao | 257/758 |
| 6,054,379 A | * 4/2000 | Yau | 438/623 |
| 6,054,384 A | * 4/2000 | Wang | 438/637 |
| 6,071,809 A | * 6/2000 | Zhao | 438/634 |
| 6,077,571 A | * 6/2000 | Kaloyceros | 427/576 |
| 6,100,184 A | * 8/2000 | Zhao | 438/638 |
| 6,127,089 A | * 10/2000 | Subramanian et al. | 430/270 |
| 6,156,643 A | * 12/2000 | Chan et al. | 438/638 |
| 6,159,661 A | * 12/2000 | Huang | 430/313 |
| 6,197,181 B1 | * 3/2001 | Chen | 205/123 |

FOREIGN PATENT DOCUMENTS

| | | |
|---|---|---|
| EP | 0 731 503 A2 | 9/1996 |
| EP | 0 793 268 A2 | 9/1997 |
| JP | 106357 * 4/2000 | H01L/21/3065 |

OTHER PUBLICATIONS

Wolf, Silicon Processing For the VLSI Era, vol. 2: Process Integration; Sunset Beach, CA: Lattice Press, 1990, pp. 238–239.*

(List continued on next page.)

Primary Examiner—Mary Wilczewski
(74) Attorney, Agent, or Firm—Farjami & Farjami LLP

(57) ABSTRACT

Interconnects in sub-micron and sub-half-micron integrated circuit devices are fabricated using a dual damascene process incorporating a low-k dielectric. A dual-damascene structure can be implemented without the necessity of building a single damascene base, and without CMP of the low-k dielectric. This structure simplifies the manufacturing process, reduces cost, and effectively reduces intra-level and inter-level capacitance, resistivity, and noise related to substrate coupling. In accordance with a further aspect of the present invention, a modified silicon oxide material such as silsesquioxane is used for the low-k dielectric in conjunction with silicon dioxide cap layers, allowing an improved process window and simplifying the etching process.

43 Claims, 4 Drawing Sheets

OTHER PUBLICATIONS

"Technology Challenges for Advanced Interconnects", James G. Ryan, et al., Conference Proceedings ULSA XIII 1998 Materials Research Society, pp. 399–404.

James G. Ryan, et al., Technology Challenges for Advanced Interconnects, 1998 Materials Research Society, pp. 399–404.

J. Givens et al., Selective Dry Etching in a High Density Plasma for 0.5 um Complementary Metal–Oxide–Semiconductor Technology, 1994 American Vacuum Society, J. Vac. Sci. Technol. B 12(1), Jan./Feb. 1994, pp. 427–430.

B. Zhao et al, Aluminum Dual Damascene Interconnects With Low–k Intra/Inter–Level Dielectric for Reduced Capacitance and Low Cost.

B. Zhao et al, A Cu/Low–k Dual Damascene Interconnect for High Performance and Low Cost Integrated Circuits.

Peter Singer, Making the Move to Dual Damascene Processing, Aug. 1997, Semiconductor International/79.

* cited by examiner

Dual Damascene

Single Damascene

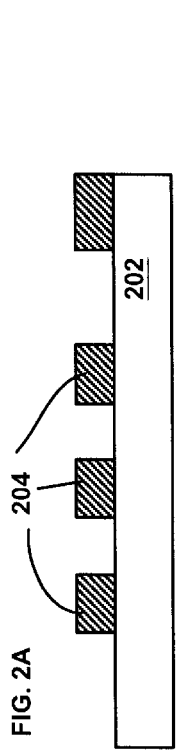
FIG. 2A
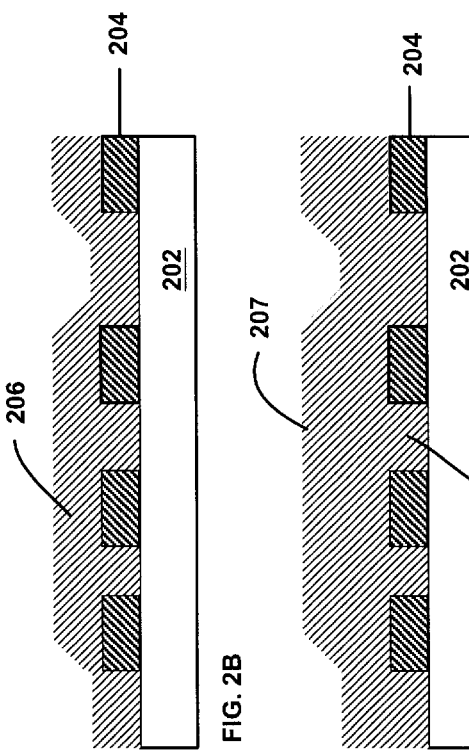
FIG. 2B
FIG. 2C
FIG. 2D
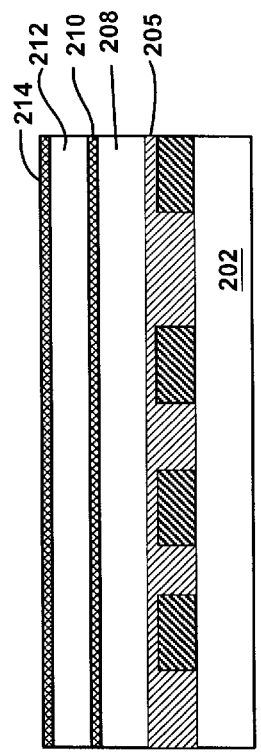
FIG. 2E
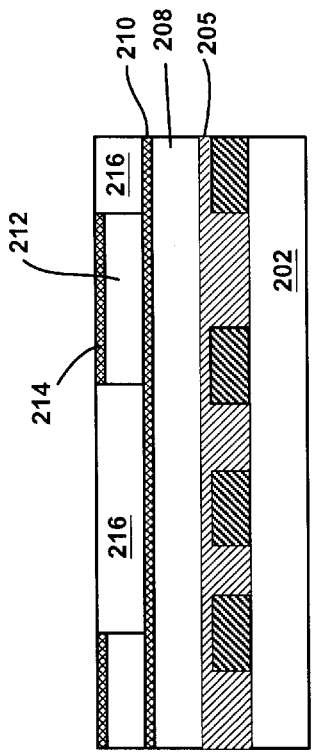
FIG. 2F
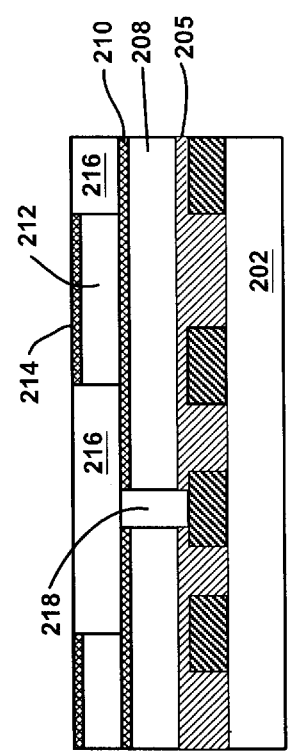
FIG. 2G

METHOD OF FORMING DUAL-DAMASCENE INTERCONNECT STRUCTURES EMPLOYING LOW-K DIELECTRIC MATERIALS

CROSS-REFERENCES TO RELATED APPLICATIONS

This application claims the benefit of U.S. Provisional Application No. 60/087,116, filed May 29, 1998, hereby incorporated by reference.

TECHNICAL FIELD

The present invention relates, generally, to methods and structures for multilevel interconnects in integrated circuits using planarization technology and, more particularly, to a dual-damascene approach employing a low-k dielectric.

BACKGROUND ART AND TECHNICAL PROBLEMS

Advanced semiconductor processing technology has permitted the fabrication of integrated circuit devices with sub-micron and sub-half-micron features sizes. This trend toward deep submicron technology (i.e., involving feature sizes less than 0.35 microns) has, in turn, driven the need for multilayer interconnects. As a result, circuit performance in the deep submicron regime is increasingly a function of the delay time of electronic signals traveling between the millions of gates and transistors present on the typical integrated circuit chip. Parasitic capacitance and resistance effects resulting from these otherwise passive interconnect structures must therefore be well-controlled. Toward this end, recent trends emphasize the use of low resistance metals (e.g., copper) in conjunction with materials with low dielectric constants ("low-k dielectrics") between metal lines.

Optical lithography techniques have, for the most part, managed to keep pace with deep sub-micron requirements through the use of off-axis illumination, phase shifting masks, and other methods known in the art. However, the decreasing depth of focus that accompanies this increase in resolution requires the production of highly planar surfaces during intermediary process steps. In light of the need for highly planar surfaces, traditional metal deposition and photolithographic techniques become progressively more ineffective as line widths are scaled and multiple layers of metal are used. For example, traditional metal deposition techniques can result in poor metal step coverage along the edges of the contact openings. Furthermore, wet chemical etch processes typically used with metals are difficult to control. While dry plasma etching may be employed with many metals, other metals with highly desirable properties (e.g., copper and gold) are generally not amenable to dry etching.

Modern semiconductor processing techniques increasingly employ Chemical-Mechanical Polishing (CMP) to create the interconnect layers, particularly where the number of layers rises above three and the conductive lines themselves are characterized by a high aspect ratio (e.g., lines on the order of 0.25 $\mu$m in width and on the order of 1.0 $\mu$m in height). In a paradigmatic CMP process, a resinous polishing pad (e.g., a polyurethane pad) is employed in conjunction with a mechanically and chemically active slurry. When pressure is applied between the polishing pad and the wafer being polished, mechanical stresses are concentrated on the exposed edges of the adjoining cells in the cellular pad. Abrasive particles within the slurry concentrated on these edges tend to create zones of localized stress at the workpiece in the vicinity of the exposed edges of the polishing pad. This localized pressure creates mechanical strain on the chemical bonds comprising the surface being polished, rendering the chemical bonds more susceptible to chemical attack by the slurry. Thus, with the correct choice of slurry, pressure, and other process conditions, a highly planar surface may be formed on the wafer. For additional information regarding CMP process, see, for example, Karlsrud, U.S. Pat. No. 5,498,196, issued March, 1996; Arai, et al., U.S. Pat. No. 5,099,614, issued March, 1992; and Arai, et al, U.S. Pat. No. 4, 805,348, issued February, 1989. The entire contents of these references are hereby incorporated by reference.

A fabrication method which employs CMP techniques and which addresses many of the above concerns is the so-called "damascene" process. Damascening acquired its name from an ornamental technique, generally attributed to metal-workers in ancient Damascus, which involved scribing or incising patterns into steel (most often swords) then filling the resulting grooves with gold or silver prior to final polish. Similarly, the modern semiconductor analog of this process involves, in the broadest sense, forming patterns in a dielectric layer, filling the resulting pattern with interconnect metal, then polishing away the excess metal on the wafer surface and leaving inlaid interconnect metal.

There are two major classes of damascene processes: single-damascene and dual-damascene. These two processes are illustrated in highly simplified form in FIGS. 1A and 1B (details of the various intermediary steps are discussed in further detail below). Briefly, and with reference to FIG. 1A, a single damascene process involves making contact to a lower conductor 102 (formed, for example, on substrate 107) by patterning and forming a conductive plug 104 in one layer of dielectric 106, then patterning second dielectric layer 110, and forming the actual interconnect wiring metallization 108 in patterned dielectric layer 110. In a dual-damascene process (FIG. 1B), the interconnect wiring 108 and plug 104 are formed by patterning both the via and the trench patterns into dielectric 106, then filling them simultaneously with metal. The dual damascene process offers the advantages of process simplification and low manufacturing cost.

Known methods of forming deep sub-half-micron damascene interconnect structures using low-k dielectrics are unsatisfactory in many respects. First, such methods typically employ a single-damascene approach. This results in a larger number of process steps—a number which tends to increase as feature size decreases—and, consequently, increases the overall product cost. In cases where a dual damascene architecture is employed, the low-k dual damascene processes typically require either a single damascene process as the starting point or CMP of the low-k material. In order to obtain the inlaid metal features with metal CMP, a damascene process requires a planar wafer surface. The first interconnect layers (e.g.., poly-Si conductor layer or lower levels of Al interconnects) on an IC chip are typically fabricated by a subtractive-etch process, and CMP of the subsequently deposited dielectric must be performed in order to obtain a planar wafer surface.

To avoid CMP of the low-k material—a process which is difficult to perform—known low-k dual damascene processes start from a previous level of conductors fabricated by a single damascene process. Before the single damascene conductors are fabricated, a planar wafer surface is obtained by CMP of a conventional dielectric, such as silicon dioxide, and the contact or via plugs are formed in the conventional dielectric layer. However, the single damascene step results in relatively high process cost, and the conventional dielectric between the single damascene conductor layer and the previous subtractive-etched conductor layer increases the capacitance and coupling between them.

Methods and structures are therefore needed in order to overcome these and other limitations in the prior art.

SUMMARY OF THE INVENTION

The above disadvantages of the prior art may be addressed by an improved dual-damascene process. Methods according to various aspects of the present invention provide techniques for fabricating IC interconnects using a dual-damascene process which incorporates a low-k dielectric material. In accordance with one aspect of the present invention, a low-k dual-damascene structure can be implemented without the necessity of using a previous single damascene wiring layer, and without CMP of the low-k dielectric. This structure simplifies the process, and effectively reduces intra-level and inter-level capacitance, reduces resistivity, and reduces noise related to substrate coupling. In accordance with a further aspect of the present invention, a modified silicon oxide material (e.g. silsesquioxane) is used for the low-k dielectric in conjunction with the silicon dioxide cap layers, allowing an improved process window and simplifying the etching process.

BRIEF DESCRIPTION OF THE DRAWING FIGURES

The subject invention will hereinafter be described in conjunction with the appended drawing figures, wherein like numerals denote like elements, and:

FIGS. 2A–2L depict cross-sectional views corresponding to an exemplary dual-damascene process in accordance with various aspects of the present invention.

DETAILED DESCRIPTION OF PREFERRED EXEMPLARY EMBODIMENTS

Figure 1B:
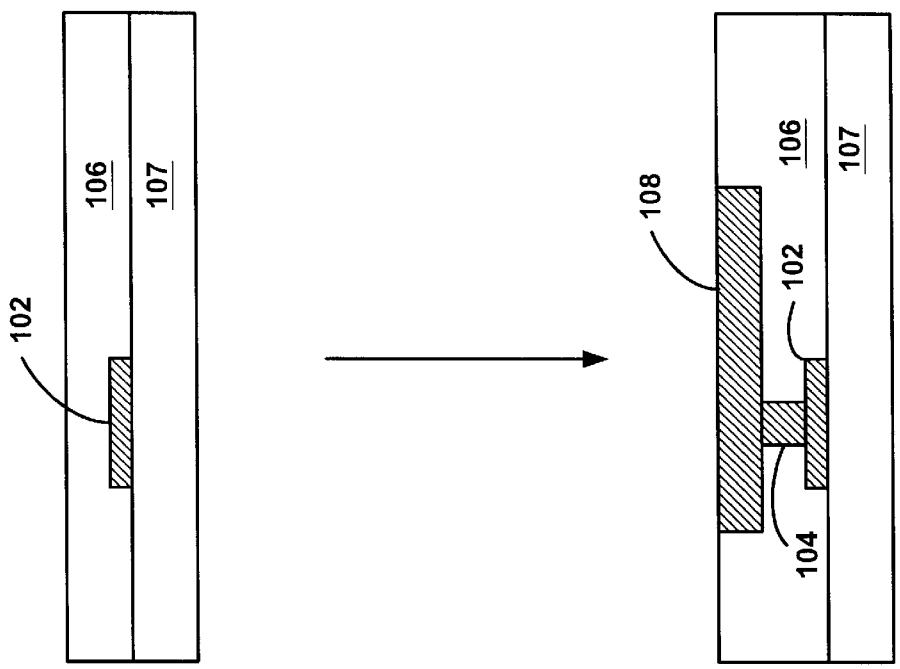
FIG. 1B is a diagrammatic illustration of a conventional dual-damascene interconnect process.
Figure 1A:
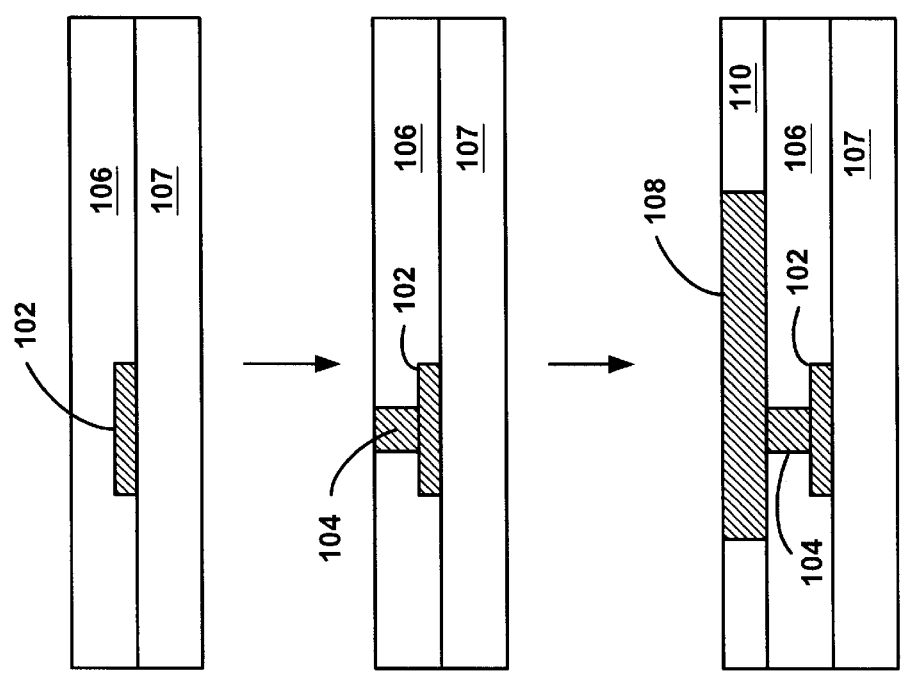
FIG. 1A is a diagrammatic illustration of a conventional single damascene interconnect process.

An interconnect fabrication process in accordance with various aspects of the present invention utilizes a dual-damascene scheme incorporating a low-k inter/intra-level dielectric material. With momentary reference to FIG. 2I, a simplified dual-damascene process employs low-k dielectric layers 208 and 212 in conjunction with cap dielectric layers 210 and 214 to form an interconnect metal structure 220 with reduced intralevel and interlevel capacitance. In accordance with an illustrated embodiment, a dual-damascene structure can be implemented without the necessity of using previous single damascene wiring layer, and without CMP of the low-k dielectric.

Referring now to FIGS. 3 and 2A–2L, an interconnect fabrication process in accordance with various aspects of the present invention will now be described in detail. It should be understood that the exemplary process illustrated may include more or less steps or may be performed in the context of a larger processing scheme.

Prior to performing the dual damascene process steps, a first metal layer 204 and dielectric 206 are initially formed on substrate 202 as shown in FIG. 2D. In a preferred embodiment, and as described further below, a thin layer of dielectric material is left remaining on top of metal layer 204. This structure, which helps achieve the objects of the present invention, may be formed in a variety of ways. In the illustrated embodiment, processing takes place as depicted in FIGS. 2A–2C.

Specifically, a metal layer 204 (or, more generally, a conductor) is deposited on substrate 202 and patterned using conventional techniques, for example, through sputter deposition followed by photolithography and plasma etching (FIG. 2A). Metal layer 204 suitably comprises a layer or layers of metal (e.g., aluminum, aluminum alloys, titanium, titanium nitride, tantalum, tantalum nitride, gold, copper, copper alloys, molybdenum, silver, tungsten, etc.), polycrystalline silicon ("polysilicon"), or a variety of other conductive materials.

Next, a dielectric 206 is deposited for gap fill; i.e., to fill gaps within the patterned conductor layer 204 (FIG. 2B). Dielectric 206 suitably comprises a layer or layers of silicon dioxide (doped or undoped), silicon nitride, silicon oxynitride, or a variety of other substantially non-conductive materials. In the illustrated exemplary embodiment, dielectric 206 used for gap fill comprises a layer of high-density plasma (HDP) chemical vapor deposition (CVD) silicon dioxide. A suitable thickness of this layer is approximately 0.5–1.0 microns. Other gap fill techniques, such as PECVD deposit-etch-deposit technique may be employed.

As shown in FIG. 2C a second dielectric layer 207 is then preferably deposited on top of layer 206 using conventional CVD techniques, for example, plasma-enhanced chemical vapor deposition (PECVD). This layer, which is preferably about 0.4–1.0 microns, is then planarized and polished back using CMP such that a thin layer of dielectric 205 approximately 0.1 microns thick remains above metal 204. Alternatively, all of dielectric material 205 may be removed from the top of metal 204.

Substrate 202 consists of any suitable structure or material upon which or within which semiconductor devices are formed. Suitable materials include, for example, group IV semiconductors (i.e., Si, Ge, and SiGe), group III–V semiconductors (i.e., GaAs, InAs, and AlGaAs), and other less-conventional materials, such as SiC, diamond, and sapphire. Substrate 202 may comprise single crystal material, or may comprise one or more polycrystalline or amorphous epitaxial layer formed on a suitable base material. It will be appreciated that substrate 202 may also comprise various devices incorporated into a semiconductor material as well as interconnect structures consisting of conductive paths and various dielectrics for isolating these conductive paths.

Referring now to FIG. 2E, after fabrication of the first layer conductor, a low-k dielectric layer 208 is deposited (Step 304). Generally, a low-k dielectric is a dielectric material which exhibits a dielectric constant substantially less than conventional dielectric materials such as silicon dioxide, silicon nitride, and silicon oxynitride. Silicon dioxide, for example, has a dielectric constant of about 4.0.

Dielectric 208 therefore suitably comprises one or more layers of inorganic, organic, or hybrid inorganic-organic low-k materials. In a preferred embodiment, dielectric layer 208 comprises a silsesquioxane monomer having a thickness of about 0.4–0.8 microns. Suitable silsesquioxanes include, for example, hydrogen silsesquioxane (HSQ) and methyl-silsesquioxane (MSQ). Such materials have been found to exhibit dielectric constants in the range of about 2.2 to 3.2. Layer 208 is suitably formed using a conventional spin-on process followed by a standard curing step of the kind well known in the art. In general, low-k dielectric preferably comprises a material with a chemical structure similar to that of silicon dioxide, for example, porous silicon oxide (e.g., aerogel or xerogel formed through an appropriate spin-on process followed by suitable curing) and fluorinated silicon oxide (formed through a PCVD process). Such materials have been found to exhibit dielectric constants in the range of about 1.2 to 3.8.

In Step 306, a cap dielectric layer 210 is formed over low-k dielectric layer 208. In a preferred embodiment, layer 210 comprises a PECVD layer of silicon dioxide approximately 0.1–0.3 microns thick, although other cap materials and thicknesses are suitable.

In Steps 308 and 310, a second low-k dielectric layer 212 and second cap dielectric layer 214 are formed as detailed above in connection with Steps 304 and 306. It should be appreciated that layers 212 and 214 may be formed with thicknesses differing from layers 208 and 210 respectively. The present invention is not limited to the case where the layer materials and thicknesses are the same.

Referring now to FIGS. 2F and 2G, the desired wiring and via patterns are formed in layers 208, 210, 212, and 214, as well as the thin oxide layer 205 above conductor 204 (Step 312). In an exemplary embodiment, this step involves forming trenches 216 (FIG. 2F) and vias 218 (FIG. 2G) using a trench-first dual-damascene process. Alternatively, a via-first process may be employed to fabricate trenches 216 and vias 218. The task of transferring the interconnect vias and wiring pattern into low-k dielectric layers 208 and 212 is suitably accomplished using conventional dual-damascene patterning techniques. See, for example, J. G. Ryan et al., Advanced Metallization and Interconnect Systems for ULSI Applications in 1997, p. 399 (Sep. 30–Oct. 2, 1997); and P. Singer, Semiconducter International, vol.20, no.9, p. 79 (August 1997). In a preferred embodiment, fluorocarbon based chemistries are used for etching both the oxide cap layers and low-k layers, thereby reducing process complexity.

During Step 312, cap layer 210 between the two low-k layers serves as an etch buffer for the low-k dielectric etch to form the trench. Both top cap layer 214 and middle cap layer 210 serve as protection layers for the photoresist strip. Under conventional plasma etch conditions for silicon dioxide, a preferred low-k material (i.e., silsesquioxane) exhibits an etch rate approximately twice that of silicon dioxide. For additional information regarding etching of silicon dioxide, silicon nitride, and the like, see, for example, Givens et al., Selective dry etching in a high density plasma for 0.5 $\mu$m complementary metal-oxide-semiconductor technology, J. Vac. Sci. Technol. B, p. 427 (January/February 1994). The low-k material is suitably etched in gas mixtures of a type used for silicon dioxide, thereby greatly simplifying etch-tool configurations and chemistry employed.

Patterning Step 312 is suitably performed in conjunction with various known lithographic techniques, for example, conventional optical lithography (including, for example, I-line and deep-UV), X-ray, or E-beam lithography. After patterning in Step 312, a cleaning step such as sputter clean or reactive gas clean may be employed in order to prepare the surfaces for further processing (Step 314).

In Step 318, one or more metal layers are formed. Depending on the particular process, a suitable adhesion/wetting/barrier metal layer may be deposited within trenches 216 and vias 218. As is known in the art, adhesion layers generally assist in strengthening the bond between metal and dielectric layers, and barrier layers provide a barrier to prevent the migration or alloying of one material into another (for example, copper diffusion into silicon). Wetting layers promote metal fill in high aspect-ratio features. In this regard, it should be appreciated that a single material may exhibit one or more of these properties in a particular context. Thus, the terms "adhesion layer", "wetting layer", and "barrier layer" as used herein are not meant to be limiting.

The adhesion/wetting/barrier layer (not shown in FIG. 2) may consist of a variety of materials, for example, titanium, titanium nitride, tantalum, tantalum nitride, tungsten nitride, TiSiN, TaSiN, CoWP, tungsten, and/or molybdenum. In an exemplary embodiment involving aluminum metallization, a thin Ti wetting layer approximately 25–50 nm thick is deposited at 20 degrees Celsius through Hollow Cathode Magnetron (HCM) sputtering. Such systems are known in the art. See, for example, U.S. Pat. No. 5,482,611, issued to Helmer et al. Alternatively, collimated Ti deposition may be employed. In an embodiment using a copper metallization scheme, an adhesion/barrier layer suitably comprises a Ta and/or TaN film deposited using ionized metal plasma (IMP) sputtering at a temperature less than approximately 350° C.

Figure 2K:
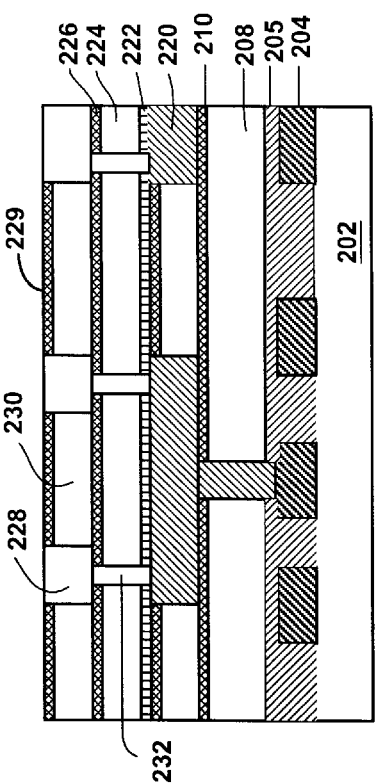
Figure 2L:
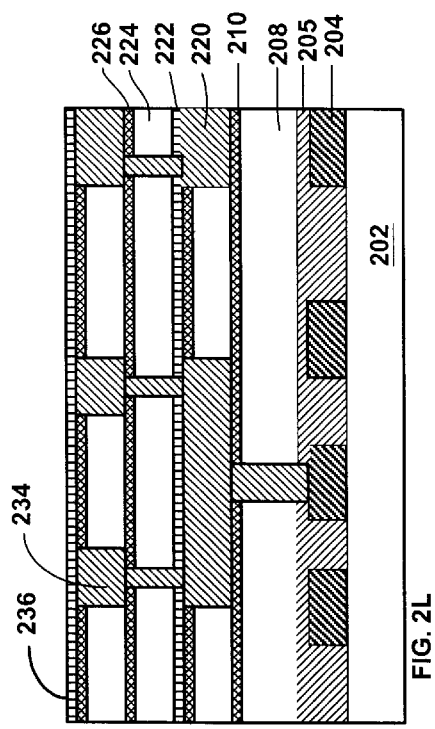
Figure 2H:
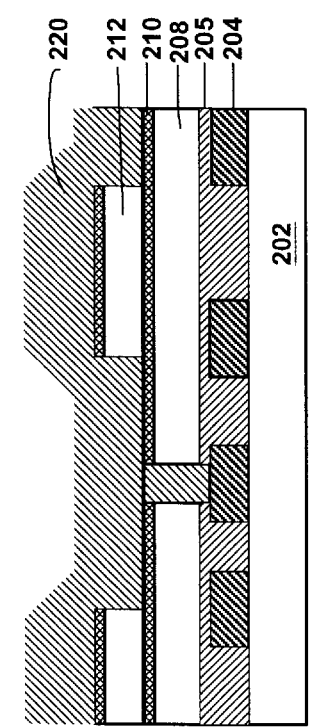

Referring now to FIG. 2H, Step 318 involves depositing bulk metal 220 within the previously formed vias and trenches such that metal 220 makes electrical contact with first level metal (or conductor) 204. Metal 220 suitably consists of a layer or layers of various conductive materials, including, for example, titanium, titanium nitride, tantalum, tantalum nitride, tungsten nitride, aluminum, aluminum-copper alloys, gold, copper, silver, tungsten, or any other suitable conductive material. It will be appreciated that use of the term "interconnect metal" does not limit the present invention to metallic interconnects; other suitable conductors, for example, polysilicon, may be employed.

Deposition of metal 220 may be performed using a variety techniques. In a first embodiment, metal 220 comprises Al—Cu(0.5%) deposited using a low pressure sputtering process at a pressure of about 0.6 mTorr and a wafer temperature of about 400 degrees Celsius. The thickness of metal 220 in this embodiment is suitably 1.2–2.0 microns thick, although other metal thicknesses may be used. In addition to low-pressure sputtering, HCM sputtering, and any suitable combination of PVD and CVD metal deposition techniques may be employed.

In an alternate embodiment, metal 220 comprises copper deposited using electrochemical deposition (or "electroplating"). Copper is desirable in that its conductivity is relatively high and it is less susceptible to electromigration failure than many metals (for example, aluminum). Many commercial tools are suitable for this copper-forming step, including, for example, the EQUINOX tool manufactured by Semitool and the SABRE tool manufactured by Novellus. Such a system suitably employs a $CuSO_4$-based bath at room temperature using a DC/pulse current waveform control. Alternatively, conventional CVD and/or high-temperature PVD processes may be employed for copper deposition. In a preferred embodiment, a barrier layer and a copper seed layer are deposited prior to forming bulk copper layer 220. The seed layer helps in delivering electron current uniformly on the wafer for initiation of copper plating. The barrier and copper seed layers are suitably formed using IMP or HCM sputtering deposition for better bottom and sidewall coverage. Alternatively, the barrier and copper seed layers may be deposited using CVD.

Figure 2I:
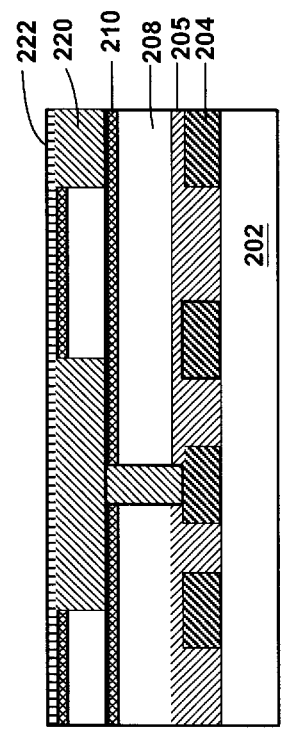

In Step 320, the excess metal 220 and corresponding adhesion/wetting/barrier layers on the field are removed, forming a substantially planar top surface (FIG. 2I). In an exemplary embodiment, this planarization step is performed using a conventional CMP process. In the aluminum metallization context, a suitable CMP slurry comprises a mixture of hydrogen peroxide and an alumina abrasive used in conjunction with a polyurethane-based pad such as any of the IC1000 pads manufactured by Rodel.

A suitable slurry for copper CMP consists of any one of the following combinations: hydrogen peroxide and alumina; ammonium hydroxide and alumina; or nitric acid and alumina. This process can be performed using a conventional polyurethane pad, for example, the IC1000 and IC 1400 pads manufactured by Rodel. During the CMP process, layer 214 serves as a CMP-stop layer to protect the low-k film.

In Step 322, a passivation layer 222 is formed over the planarized surface as shown in FIG. 2I. Passivation layer 222 preferably comprises silicon dioxide, silicon nitride, or silicon oxynitride formed using conventional processing techniques such as PECVD. In the case where metal 220 is copper, silicon nitride is preferably used as at least a barrier layer to prevent copper diffusion.

Figure 2J:
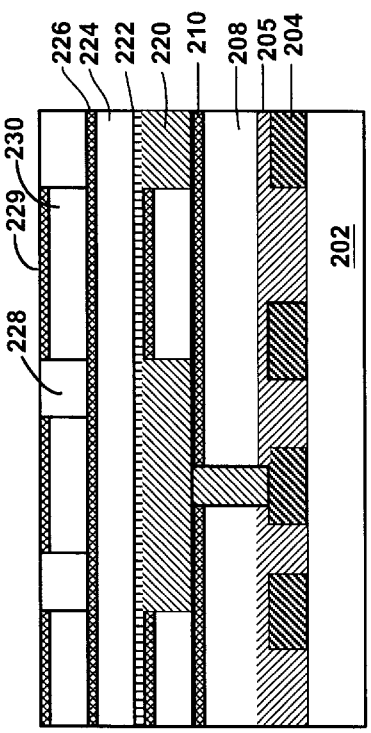
Figure 3:
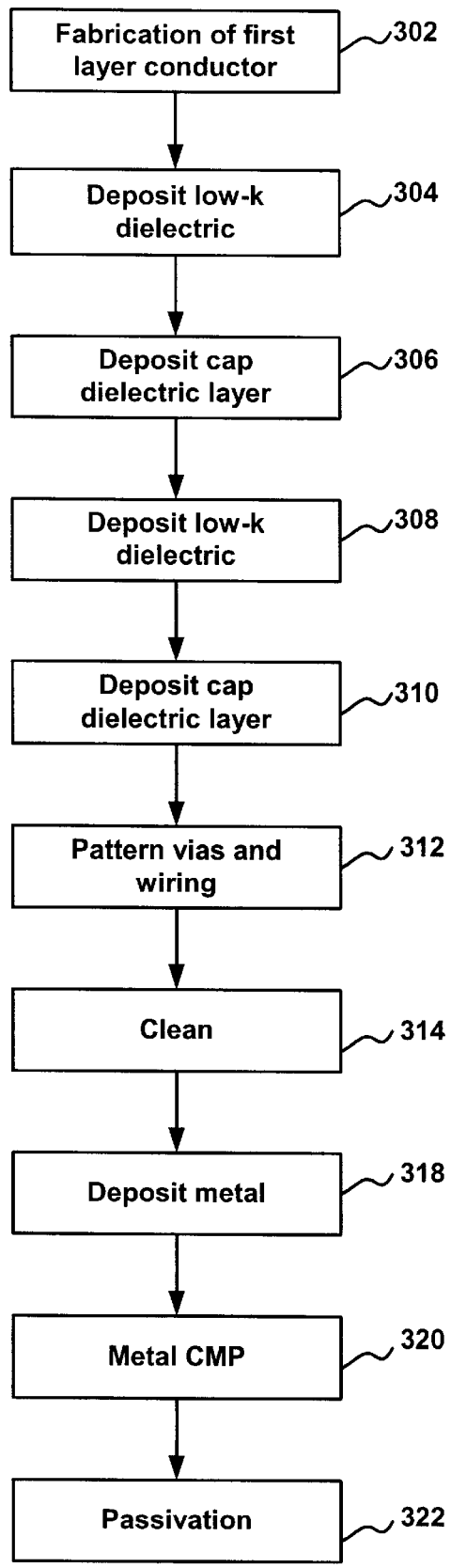
FIG. 3 is a flowchart depicting an exemplary dual-damascene process in accordance with the present invention.

Thus, upon completion of Step 322, a dual-damascene structure has been advantageously formed within the low-k material layers. It will be appreciated that multiple interconnect levels may be fabricated using methods in accordance with the present invention. More particularly, as shown in FIGS. 2J–2L, it is possible to repeat Steps 304–322 to form subsequent dual damascene structures—for example, by depositing metal 234 within trenches 228 and vias 232 formed within low-k dielectric layers 230 and 224 respectively.

Although the invention has been described herein in conjunction with the appended drawings, those skilled in the art will appreciate that the scope of the invention is not so limited. Various modifications in the selection, design, and arrangement of the various components and steps discussed herein may be made without departing from the scope of the invention.

What is claimed is:

1. A method comprising the steps of:
   providing a conductor pattern;
   filling gaps within the conductor pattern with a gap-fill dielectric to form a conductor layer;
   planarizing said conductor layer;
   forming a low-k dielectric layer directly on said conductor layer such that no material is situated between said conductor layer and said low-k dielectric layer;
   patterning said low-k dielectric layer to form vias and trenches;
   forming a metal layer within said vias and said trenches such that said metal layer is electrically continuous with said conductor pattern; and
   removing excess regions of said metal layer from said low-k dielectric layer to form a substantially planar surface; and
   where said method is used to form an interconnect structure in an integrated circuit.

2. The method of claim 1, wherein said steps of forming said low-k dielectric layer comprise the step of depositing a modified silicon oxide layer.

3. The method of claim 2, wherein said step of depositing a modified silicon oxide layer comprises the step of depositing a layer of silsesquioxane.

4. The method of claim 1, wherein said steps of forming said low-k dielectric layer comprise the step of depositing a porous silicon dioxide layer.

5. The method of claim 1, wherein said steps of forming said low-k dielectric layer comprise the step of depositing a flourinated silicon dioxide layer.

6. The method of claim 1, wherein said step of forming a metal layer comprises the step of depositing a layer of aluminum.

7. The method of claim 1, wherein said step of forming a metal layer comprises the step of depositing a layer of Al—Cu(0.5%).

8. The method of claim 7, wherein said Al—Cu(0.5%) is deposited using low-pressure sputtering, HCM sputtering, IMP sputtering, CVD, or a combination of CVD and PVD deposition.

9. The method of claim 1, wherein said step of forming a metal layer comprises the step of depositing a bulk layer of copper.

10. The method of claim 9, wherein said copper is deposited using electrochemical deposition.

11. The method of claim 9, further comprising the step of depositing a copper seed layer within said trenches and said vias prior to said step of depositing said bulk layer of copper.

12. The method of claim 1, further comprising the step of depositing a barrier layer, an adhesion layer, or a wetting layer within said trenches and said vias.

13. The method of claim 1, wherein said steps of forming said first and second cap dielectric layers comprises the step of depositing a layer of silicon dioxide.

14. The method of claim 1, wherein said patterning step comprises the step of performing a trench-first patterning process.

15. The method of claim 1, wherein the low-k dielectric layer comprises a first low-k dielectric layer, a first cap dielectric layer, a second low-k dielectric layer and a second cap layer; wherein the patterning step comprises:
   etching the second cap dielectric layer and second low-k dielectric layer to the first cap dielectric layer, the first cap dielectric layer acting as an etch stop, to form a plurality of trenches; and
   etching the first cap dielectric layer and first low-k dielectric layer to the conductor pattern to form a plurality of vias.

16. A method for forming an interconnect in an integrated circuit, comprising:
   depositing and patterning a conductor;
   forming a gap-fill dielectric layer over said conductor;
   forming a second dielectric layer over said gap-fill layer;
   planarizing said gap-fill dielectric layer and said second dielectric layer such that a thin layer of dielectric remains over said conductor;
   forming a first low-k dielectric layer on said conductor and gap-fill dielectric;
   forming a first cap dielectric layer over said first low-k dielectric layer;
   forming a second low-k dielectric layer on said first cap dielectric layer;
   forming a second cap dielectric layer over said second low-k dielectric layer;
   patterning said first and second low-k dielectric layers and said first and second cap dielectric layers to form vias and trenches, wherein said vias are formed in said first low-k dielectric layer and said trenches are formed in said second low-k dielectric layer, and wherein said first cap dielectric layer acts as an etch buffer during patterning;
   forming a metal layer over said second cap dielectric layer and within said vias and said trenches such that said metal layer is electrically continuous with said conductor; and removing excess regions of said metal layer from said second cap dielectric layer to form a substantially planar surface.

17. The method of claim 16, wherein the steps of forming the first and second low-k dielectric layers comprise the step of depositing a modified silicon oxide layer.

18. The method of claim 17, wherein the steps of depositing a modified silicon oxide layer comprises the step of depositing a layer of silsesquixane.

19. The method of claim 16, wherein the steps of forming said first and second low-k dielectric layers comprise the step of depositing a porous silicon dioxide layer.

20. The method of claim 16, wherein said steps of forming said first and second low-k dielectric layers comprise the step of depositing a flourinated silicon dioxide layer.

21. The method of claim 16, wherein said step of forming a metal layer comprises the step of depositing a layer of aluminum.

22. The method of claim 16, wherein said step of forming a metal layer comprisies the step of depositing a layer of Al—Cu(0.5%).

23. The method of claim 22, wherein said Al—Cu(0.5%) is deposited using low-pressure sputtering, HCM sputtering, IMP sputtering, CVD, or a combination of CVD and PVD deposition.

24. The method of claim 16, wherein said step of forming a metal layer comprises the step of depositing a bulk layer of copper.

25. The method of claim 24, wherein said copper is deposited using electrochemical deposition.

26. The method of claim 24, further comprising the step of depositing a copper seed layer within said trenches and said vias prior to said step of depositing said bulk layer of copper.

27. A method for forming an interconnect in an integrated circuit device, said method comprising the steps of:
   providing a substantially planar layer comprising a conductor and gap-fill dielectric;
   forming a first low-k dielectric layer on said conductor and gap-fill dielectric;
   forming a first cap dielectric layer over said first low-k dielectric layer;
   forming a second low-k dielectric layer on said first cap dielectric layer;
   forming a second cap dielectric layer over said second low-k dielectric layer;
   patterning said first and second low-k dielectric layers and said first and second cap dielectric layers to form vias and trenches, wherein said vias are formed in said first low-k dielectric layer and said trenches are formed in said second low-k dielectric layer, and wherein said first cap dielectric layer acts as an etch buffer during patterning wherein said patterning step comprises the step of performing a via-first patterning process;
   forming a metal layer over said second cap dielectric layer and within said vias and said trenches such that said metal layer is electrically continuous with said conductor;
   removing excess regions of said metal layer from said second cap dielectric layer to form a substantially planar surface.

28. The method of claim 27, further comprising the step of depositing a barrier layer, an adhesion layer, or a wetting layer within said trenches and said vias.

29. The method of claim 27, wherein the steps of forming the first and second low-k dielectric layers comprise the step of depositing a modified silicon oxide layer.

30. The method of claim 27, wherein the steps of depositing a modified silicon oxide layer comprises the step of depositing a layer of silsesquixane.

31. The method of claim 27, wherein the steps of forming said first and second low-k dielectric layers comprise the step of depositing a porous silicon dioxide layer.

32. The method of claim 27, wherein said steps of forming said first and second low-k dielectric layers comprise the step of depositing a flourinated silicon dioxide layer.

33. The method of claim 27, wherein said step of forming a metal layer comprises the step of depositing a layer of aluminum.

34. The method of claim 27, wherein said step of forming a metal layer comprisies the step of depositing a layer of Al—Cu(0.5%).

35. The method of claim 34, wherein said Al—Cu(0.5%) is deposited using low-pressure sputtering, HCM sputtering, IMP sputtering, CVD, or a combination of CVD and PVD deposition.

36. The method of claim 27, wherein said step of forming a metal layer comprises the step of depositing a bulk layer of copper.

37. The method of claim 36, wherein said copper is deposited using electrochemical deposition.

38. The method of claim 36, further comprising the step of depositing a copper seed layer within said trenches and said vias prior to said step of depositing said bulk layer of copper.

39. The method of claim 27, further comprising the step of depositing a barrier layer, an adhesion layer, or a wetting layer within said trenches and said vias.

40. A method comprising the steps of:
   forming a conductor pattern;
   filling gaps within the conductor pattern with a gap-fill dielectric to form a conductor layer;
   planarizing said conductor layer;
   forming at least one low-k dielectric layer directly on said conductor layer such that no material is situated between said conductor layer and said at least one low-k dielectric layer; and
   forming a dual damascene pattern into said at least one low-k dielectric layer; and
   where said method is used to form an interconnect structure in an integrated circuit.

41. The method of claim 40, wherein said step of forming said at least one low-k dielectric layer comprises a step of depositing a modified silicon oxide layer.

42. The method of claim 35, wherein said step of forming said at least one low-k dielectric layer comprises a step of depositing a porous silicon dioxide layer.

43. The method of claim 40, wherein said step of forming said at least one low-k dielectric layer comprises a step of depositing a fluorinated silicon oxide layer.

* * * * *